United States Patent [19]

Takahashi

[11] Patent Number: 5,852,366
[45] Date of Patent: Dec. 22, 1998

[54] HIGH VOLTAGE LEVEL SHIFT CIRCUIT INCLUDING CMOS TRANSISTOR HAVING THIN GATE INSULATING FILM

[75] Inventor: Mitsuasa Takahashi, Tokyo, Japan

[73] Assignee: NEC Corporation, Tokyo, Japan

[21] Appl. No.: 824,434

[22] Filed: Mar. 26, 1997

[30] Foreign Application Priority Data

Mar. 29, 1996 [JP] Japan ................................. 8-077227

[51] Int. Cl.⁶ .......................................... H03K 19/0185
[52] U.S. Cl. ........................ 326/68; 326/81; 326/102; 257/408
[58] Field of Search .................. 326/68, 80–81, 326/62, 102–103, 83, 86; 257/408, 379

[56] References Cited

U.S. PATENT DOCUMENTS 5,306,656  4/1994  Williams et al. ...................... 438/283

FOREIGN PATENT DOCUMENTS 2186826  7/1990  Japan .
5308274  11/1993  Japan .

*Primary Examiner*—Jon Santamauro
*Attorney, Agent, or Firm*—Whitham, Curtis & Whitham

[57] ABSTRACT

In order to solve problems of a conventional level shift circuit which is difficult to use since a bias voltage is needed and where a number of P-channel MOSFETs is large and an area thereof is large, a level shift circuit comprises N-channel MOSFETs N1, N2 and N3 gates of which are respectively connected to input terminals 1, 2 and 3 and sources of which are commonly connected to a low potential side power source terminal, and P-channel MOSFETs P1, P2 and P3 sources of which are connected commonly to a high potential side power source terminal and drains of which are connected respectively to drains of the N-channel MOSFETs N1, N2 and N3. The P-channel MOSFETs P1 and P2 are provided with drain intermediate taps T1 and T2, the gate of the P-type MOSFET P1 is connected to the drain intermediate tap T2 of the P-channel MOSFET P2 and the gate of the P-channel MOSFET P2 is connected to the drain intermediate tap T1 of the P-channel MOSFET P1. The P-channel MOSFET P3 is a transistor for outputting and the gate thereof is connected to the drain intermediate tap T2 of the P-channel MOSFET P2.

7 Claims, 5 Drawing Sheets

HIGH VOLTAGE LEVEL SHIFT CIRCUIT INCLUDING CMOS TRANSISTOR HAVING THIN GATE INSULATING FILM

BACKGROUND OF THE INVENTION

1. Field of the Invention

The present invention relates to a level shift circuit constituted of a CMOS (Complementary Metal Oxide Semiconductor), particularly to a level shift circuit including a CMOS which is an MOS (Metal Oxide Semiconductor) type field effect transistor (FET) element having a thin gate oxide film.

2. Description of Related Art

Conventionally, a level shift circuit constituted of a CMOS transistor has attracted attention as a level shift circuit conducting a level shift of a high voltage by an MOSFET having a thin gate oxide film (for example, Japanese Patent Laid Open Hei 5-308274, and Japanese Patent Laid Open Hei 2-186826). FIG. 7 is a circuit diagram of an example of a conventional level shift circuit. According to FIG. 7, among a first P-channel MOSFET 14 and a second P-channel MOSFET 15 gates of which are commonly connected to a bias terminal 23, a drain of FET 14 is connected to a drain of a first N-channel transistor 16 and a source of FET 14 is connected to a drain of a third P-channel MOSFET 18 and a gate of a fourth P-channel MOSFET 19 and a drain of FET 15 is connected to a drain of a second N-channel MOSFET 17 and a source of FET 15 is connected to a drain of a fourth P-channel MOSFET 19 and a gate of the third P-channel MOSFET 18.

Also, a gate of a fifth P-channel MOSFET 20 is connected to the gate of FET 18, the drain of FET 19 and the source of FET 15. Further, an input terminal 22 is connected to a gate of the second N-channel MOSFET 17 as well as to gates of the first N-channel MOSFET 16 and a third N-channel MOSFET 21 via an inventory 24.

The level shift circuit conducts level shift operation when the first N-channel MOSFET 16, the first P-channel MOSFET 14 and the fourth P-channel MOSFET 19, the second N-channel MOSFET 17 and the second P-channel MOSFET 15 and the third P-channel MOSFET 18, respectively repeat ON/OFF.

Here, the gate of the first P-channel MOSFET 14 is applied with a bias voltage lower than a power source voltage VDD (bias voltage<VDD-threshold voltage Vth1 of MOSFET 14) via the bias terminal 23. Accordingly, the drain of the third P-channel MOSFET 18 becomes at a low potential at a timing where a low level signal is inputted to the input terminal 22 by which the first N-channel MOSFET 16, the first P-channel MOSFET 14 and the fourth P-channel MOSFET 19 are respectively made ON. However, this potential is a source potential of the first P-channel MOSFET 14 and therefore, when the potential becomes lower than a voltage of a difference between the bias voltage from the bias terminal 23 and the threshold value Vth1 of the first P-channel MOSFET 14, FET 14 is made OFF.

Accordingly, the drain voltage of the third P-channel MOSFET 18 is set not lower than a voltage of a difference between the bias voltage from the bias terminal 23 and the threshold value Vth of the first P-channel MOSFET 14.

Similarly, the gate of the second P-channel MOSFET 15 is applied with the bias voltage lower than the source voltage VDD via the bias terminal 23. Accordingly, the drain of the fourth P-channel MOSFET 19 becomes at a low potential at a timing where a high level signal is inputted to the input terminal 22 by which the second N-channel MOSFET 17, the second P-channel MOSFET 15 and the third P-channel MOSFET 18 are respectively made ON. However, the potential is the source potential of the second P-channel MOSFET 15 and therefore, the drain voltage of the fourth P-channel MOSFET 19 is set such that the drain voltage does not become lower than a voltage of a difference between the bias voltage from the bias terminal 23 and a threshold value Vth2 of the second P-channel MOSFET 15.

Accordingly, the gate/source voltages of the third P-channel MOSFET 18, the fourth P-channel MOSFET 19 and the fifth P-channel MOSFET 20 oscillate between VDD and (bias voltage+Vth1 (or Vth2)) and therefore, MOSFETs having a low gate/source withstand voltage (that is, a thin gate oxide film) may be used by pertinently selecting VDD, the bias voltage, Vth1 and Vth2.

However, according to the above-described conventional level shift circuit, the bias voltage applied on the bias terminal 23 is a voltage which is near to the power source voltage VDD which is a high voltage and therefore, the bias voltage cannot be formed by the transistors having thin gate oxide films constituting the level shift circuit.

Moreover, the circuit structure becomes magnified since the circuit for generating the bias voltage is necessary other than the level shift circuit. Also, the first and the second P-channel MOSFETs 14 and 15 require a current driving capacity the same as those of the first and the second N-channel MOSFETs 16 and 17 and therefore, the area of the level shift circuit is increased.

Furthermore, normally, the mobility of a P-channel MOSFET is a half of that of an N-channel one and therefore, the P-channel MOSFET requires an area twice as much as that of the N-channel MOSFET to impart the same current driving capacities. Therefore, according to the conventional level shift circuit, in comparison with a circuit where the first and the second P-channel MOSFETs 14 and 15 for voltage conversion are not used, the area of the level shift circuit is calculated in conversion of an area of an N-channel MOSFET as follows.

$$(Pch \times 4 + Nch \times 2)/(Pch \times 2 + Nch \times 2) = (8 \times Nch)/(6 \times Nch) = 4/3 = \text{approx. } 1.33$$

Accordingly, an area 1.33 times as large as that constituted by N-channel MOSFETs is necessary.

SUMMARY OF THE INVENTION

The present invention has been carried out in view of the above-described points and it is an object of the present invention to provide a level shift circuit capable of conducting level shift by using FETs each having a thin gate oxide film by a constitution dispensing with a bias voltage.

It is another object of the present invention to provide a level shift circuit having an area of a circuit portion smaller than that in the conventional circuit.

According to an aspect of the present invention for achieving the above-described objects, there is provided a level shift circuit including a first transistor of a first conductive type a gate of which is connected to a first input terminal and a source of which is connected to a power source terminal on a side of a low potential, a second transistor of the first conductive type a gate of which is connected to a second input terminal and a source of which is connected to the power source terminal on the side of the low potential, a third transistor of the first conductive type a gate of which is connected to a third input terminal and a source of which is connected to the power source terminal on the side of the low potential, a fourth transistor of a second conductive type having a drain intermediate tap a drain of which is connected to a drain of the first transistor and a source of which is connected to a power source terminal on a side of a high potential, a fifth transistor of the second conductive type a gate of which is connected to the drain intermediate tap of the fourth transistor, a drain of which is connected to a drain of the second transistor, a source of which is connected to the power source terminal on the side of the high potential and a drain intermediate tap of which are connected to a gate of the fourth transistor and a sixth transistor of the second conductive type a gate of which is connected to the drain intermediate tap of the fifth transistor, a drain of which is connected to a drain of the third transistor and an output terminal and a source of which is connected to the power source terminal on the side of the high potential.

According to the present invention, the fourth and the fifth transistors are attached with the intermediate taps and the intermediate taps are mutually connected to the other gates by which the transistors are mutually driven, when one of the first and the second transistors is made ON, and the other is made OFF, a potential of the intermediate taps of the fourth or the fifth transistor connected to the drains of the first or the second transistor at ON state, is not lowered to the power source potential on the side of the low potential but a potential slightly lower than the power source potential on the side of the high potential whereby the fifth or the fourth transistor can be made OFF.

DETAILED DESCRIPTION OF THE PREFERRED EMBODIMENTS

An explanation will be given of embodiments of the present invention in reference to the drawings as follows.

Figure 1:
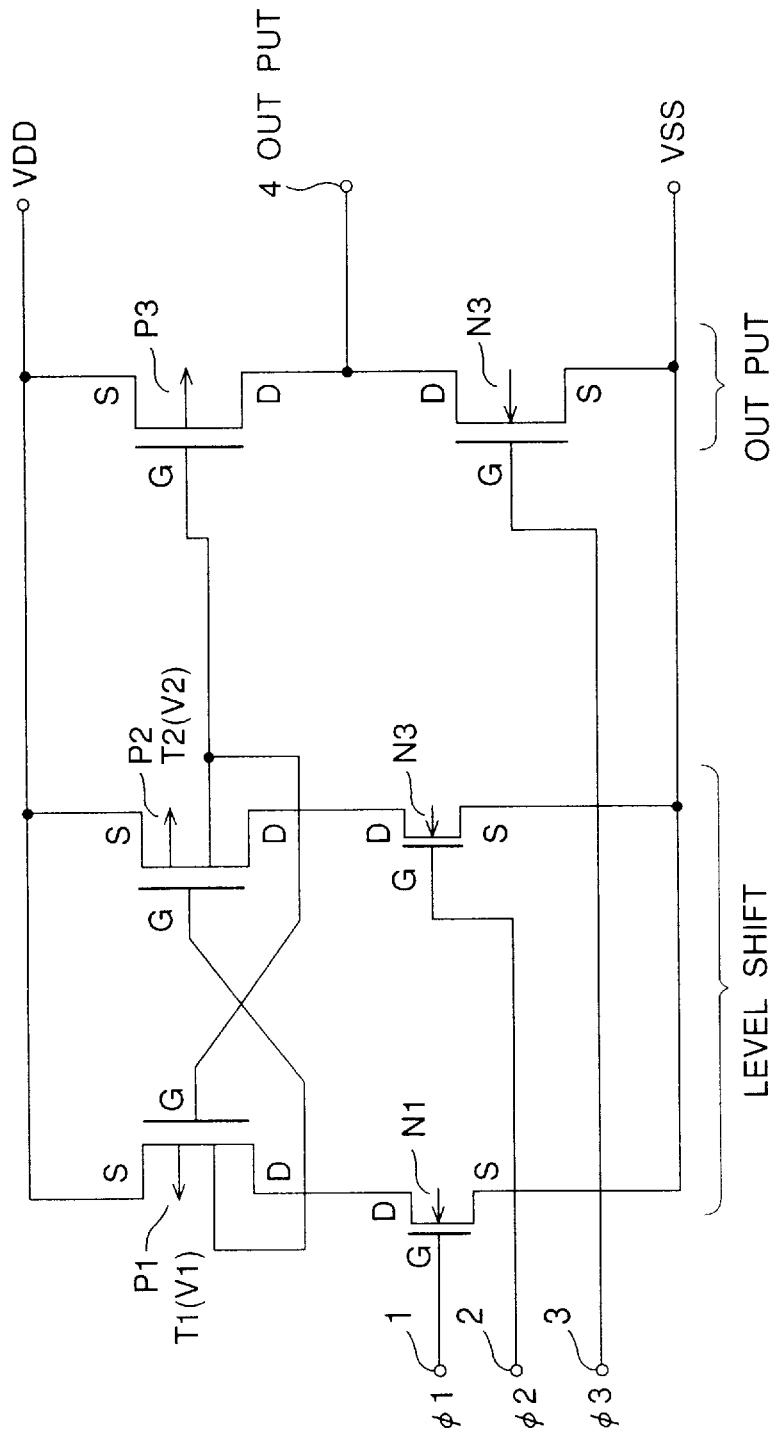
FIG. 1 is a circuit diagram of an embodiment of the present invention.

FIG. 1 is a circuit diagram of an embodiment of a level shift circuit according to the present invention. As shown by FIG. 1, according to the embodiment, the level shift circuit is constituted by a first, a second and a third N-channel MOS type field effect transistor (hereinafter, MOSFETs) N1, N2 and N3 gates of which are respectively connected to low voltage signal input terminals 1, 2 and 3 and sources of which are commonly connected to a low potential side power source terminal and a first, a second and a third P-channel MOSFET P1, P2 and P3 sources of which are commonly connected to a high potential side power source terminal and drains of which are respectively connected to drains of the first, the second and the third N-channel MOSFETs N1, N2 and N3.

Further, the first and the second P-channel MOSFETs P1 and P2 are respectively provided with drain intermediate taps T1 and T2, a gate of MOSFET P1 is connected to the drain intermediate tap T2 of MOSFET P2 and a gate of MOSFET P2 is connected to the drain intermediate tap T1 of the MOSFET P1. The third P-channel MOSFET P3 is a transistor for outputting and a gate thereof is connected to the drain intermediate tap T2 of the second P-channel MOSFET P2.

The above-described MOSFETs N1, N2, P1 and P2 constitute a level shift unit and MOSFETs N3 and P3 constitute a CMOS transistor for outputting. Respective drains of the MOSFETs N3 and P3 are commonly connected to an output terminal 4.

Figure 2:
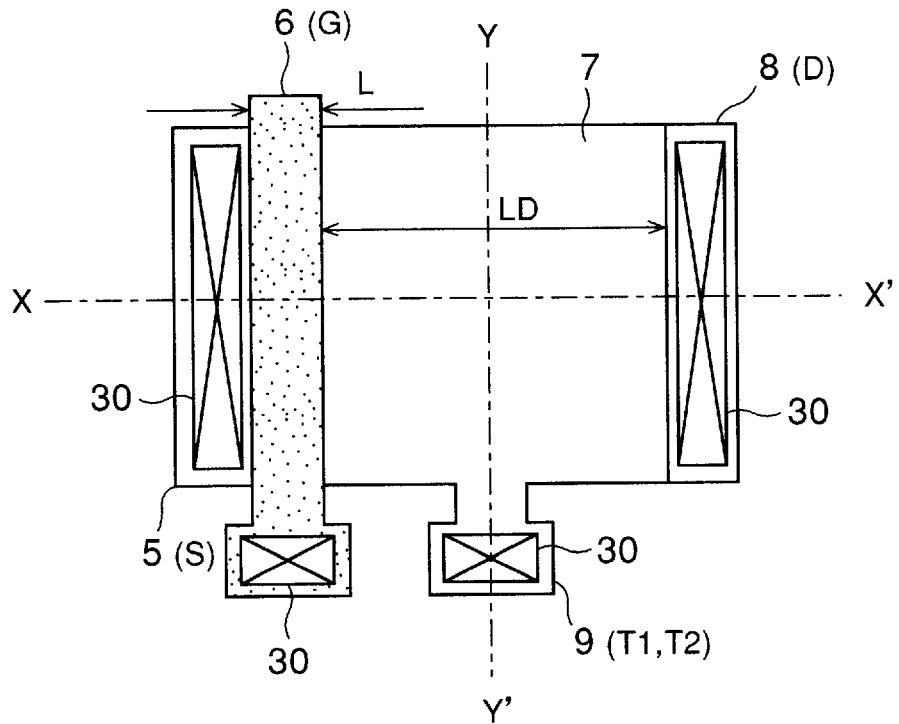
FIG. 2 is a plane view of an example of a P-channel MOSFET having an intermediate tap of FIG. 1.
Figure 3:
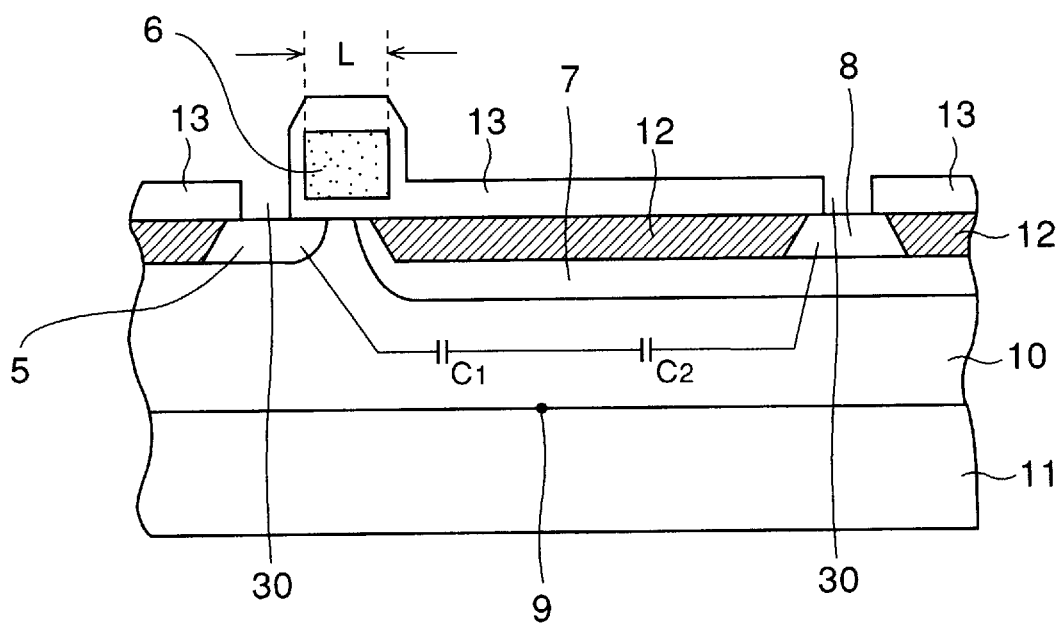
FIG. 3 is a longitudinal sectional view taken along a line X–X' of FIG. 2.
Figure 4:
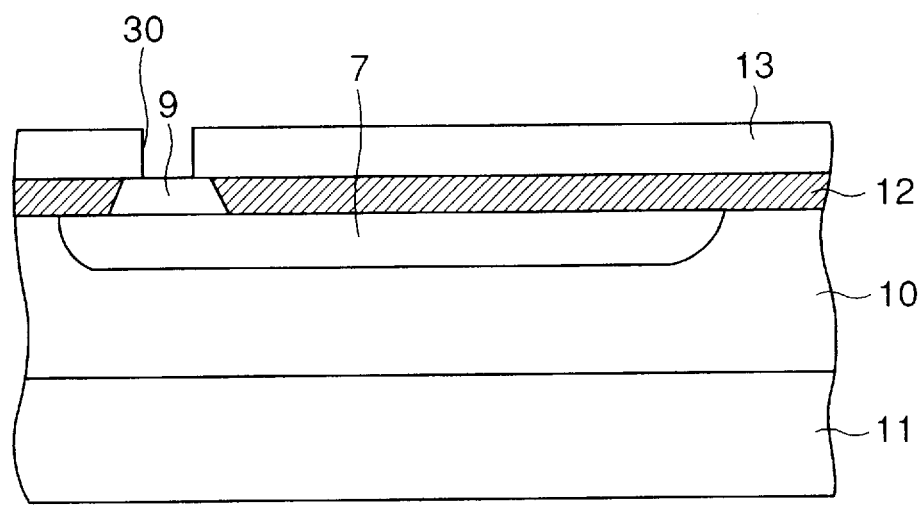
FIG. 4 is a longitudinal sectional view taken along a line Y–Y' of FIG. 2.

FIG. 2 is a plane view of the P-channel MOSFETs P1 and P2 each having the intermediate tap and FIG. 3 is a sectional view taken along a line X–X' of FIG. 2 and FIG. 4 is a longitudinal sectional view taken along a line Y–Y' of FIG. 2. Explaining the constitution of P-channel MOSFETs P1 and P2 each having the intermediate tap of FIG. 1 also in reference to FIG. 2, FIG. 3 and FIG. 4, taking an example of a P-channel MOSFET having the withstand voltage of approximately 150 V, an N well 10 is selectively formed on a P-type substrate 11 doped with boron to the degree of 13 $\Omega$cm by a photoresist step. By ion implantation of phosphor by an acceleration energy of 100 keV and a dose amount of about $3 \times 10^{12}/cm^2$ and by pushing phosphor therein at 1200° C. for about 50 hours the N well 10 is provided with a bond depth of about 10 $\mu$m and a surface concentration of about $1 \times 10^{15}/cm^3$.

Further, ion implantation of boron is conducted selectively in the N well 10 by an acceleration energy of 70 keV and a dose amount of about $2 \times 10^{12}/cm^2$ by a photoresist step and the N well 10 is oxidized at 980° C. for about 220 minutes by which a P⁻ drain 7 and a locos oxide film 12 are formed. Successively, a gate oxide film of about 500 angstrom is formed and thereafter, polysilicon doped with phosphor to a degree of about 11 $\Omega/\square$ is selectively formed by a thickness of about 6000 angstrom by which a gate 6 is formed.

Thereafter, ion implantation of boron is conducted by an acceleration energy of about 50 keV and a dose amount of $1 \times 10^{16}/cm^2$ by which a P⁺ source 5 and a P⁺ drain 8 are formed. Further, after forming an interlayer insulating film 13 of about 6500 angstrom by a CVD (Chemical Vapor Deposition) process, contact holes 30 are formed in the interlayer insulating film 13 and wirings are formed by which a high withstand voltage P-channel MOSFET having an intermediate tap is provided. At an intermediate tap portion of a P⁺ diffusion layer 9, the P⁻ drain 7 is drawn in a direction in parallel to the gate line 6 and P⁺ layers the same as the source 5 and the drain 8 are formed at the contact portions.

Figure 5:
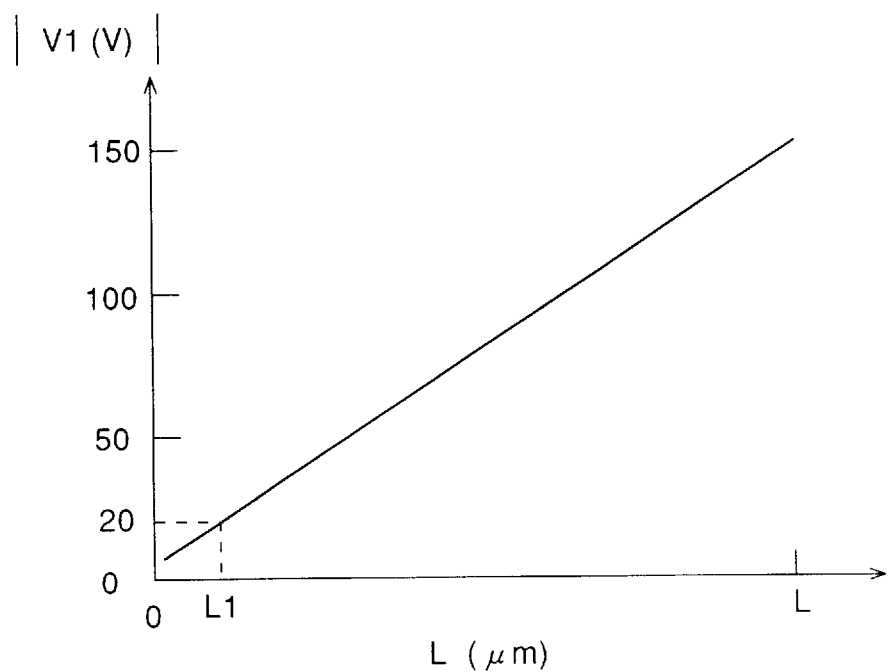
FIG. 5 is a characteristic diagram of a drawn-out distance of the intermediate tap and an intermediate tap potential.

In FIG. 5, a potential V1 (absolute value) of the intermediate tap is plotted when lengths LD of the P⁻ drains 7 of the P-channel MOSFETs P1 and P2 having the intermediate taps are fixed and the gate length L of a gate 6 is changed. (However, the channel length is changed with the change of the gate length.) That is, a dimension for providing a necessary withstand voltage is necessary in the drain offset length LD since a high voltage of VDD is applied between the drain and the source of each of the P-channel MOSFETs P1 and P2 having the intermediate taps. According to this example, as is known from FIG. 5, the MOSFETs are constituted to have a withstand voltage of about |150| (V). In such P-channel MOSFETs P1 and P2 having the intermediate taps, when a potential of the intermediate tap portion 9 drawn out from the P⁻ drain, a potential as illustrated by FIG. 5 can be taken out in accordance with the gate length L of the gate 6.

Furthermore, in the FIG. 2, the intermediate tap 9 is connected to a lim of the P⁻ drain 7, the volgate of intermediate tap 9 increases from the lim to a center of P⁻ drain 7 in direction Y–Y' and increases from the lim to a P⁺ drain 8 in direction X–X'. This phenomenon is based on capacitance coupling between P⁺ source 5 and P⁺ drain 8 via the intermediate tap 9 at cut off state of the transistor. At the cut off state of the transistor, the voltage of the intermediate tap 9 is defined by capacitance rate between a capacitance C1 and a capacitance C2. The capacitance C1 is a capacitance between P⁺ source 5 and the intermediate tap 9 and the capacitance C2 is a capacitance between P⁺ drain 8 and the intermediate tap 9, and these capacitances are defined by a distance from P⁺ source 5 and P⁺ drain 8.

For example, the drain at a position of L is at 0 V in OFF state and is provided with a voltage amplitude of 150 V (VDD) in ON state. Accordingly, when the gate length is L1, the voltage amplitude of the 130 V (150V–20V=VDD–20V: a voltage of the source potential minus 20 V at a position of L1) through 150 V (VDD) is provided.

Therefore, when such an intermediate tap is installed, the potential of the intermediate tap is changed only in the voltage range of from VDD (source potential) to VDD–V1 (potential determined by the length of L) while the drain potential of MOSFET having the intermediate tap is changed in the voltage range of VDD (source potential) to 0 V. As a result, P-channel MOSFETs each having a thin gate oxide film of about 50 nm having the withstand voltage of only about 50 V may be used as P1 and P2 of FIG. 1 whereby the P-channel MOSFETs can be formed by a gate oxide forming step the same as that of N-channel MOSFETs N1 and N2 and the step can be shortened.

Figure 6:
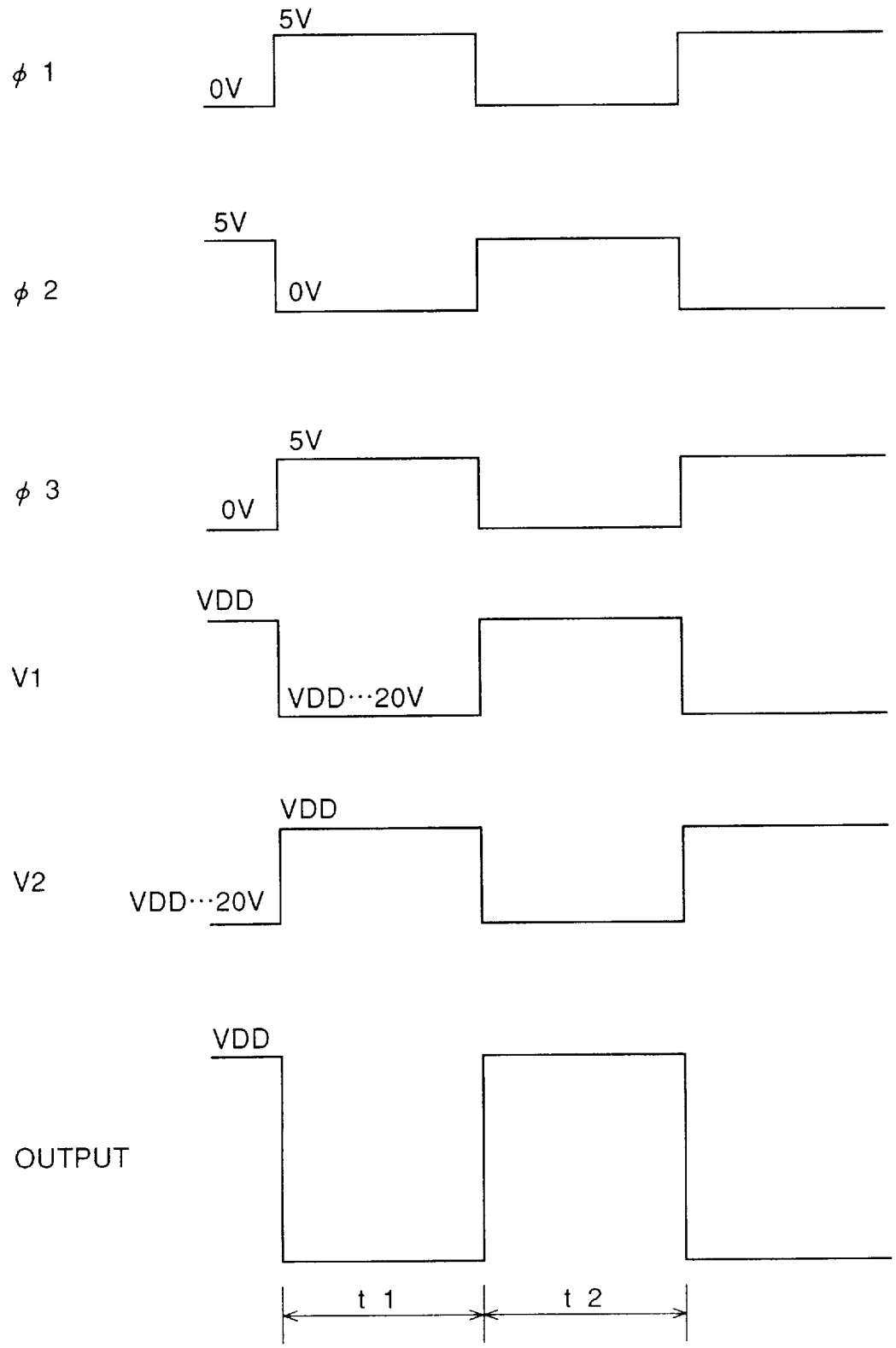
FIG. 6 illustrates timing charts for explaining the operation of FIG. 1.
Figure 7:
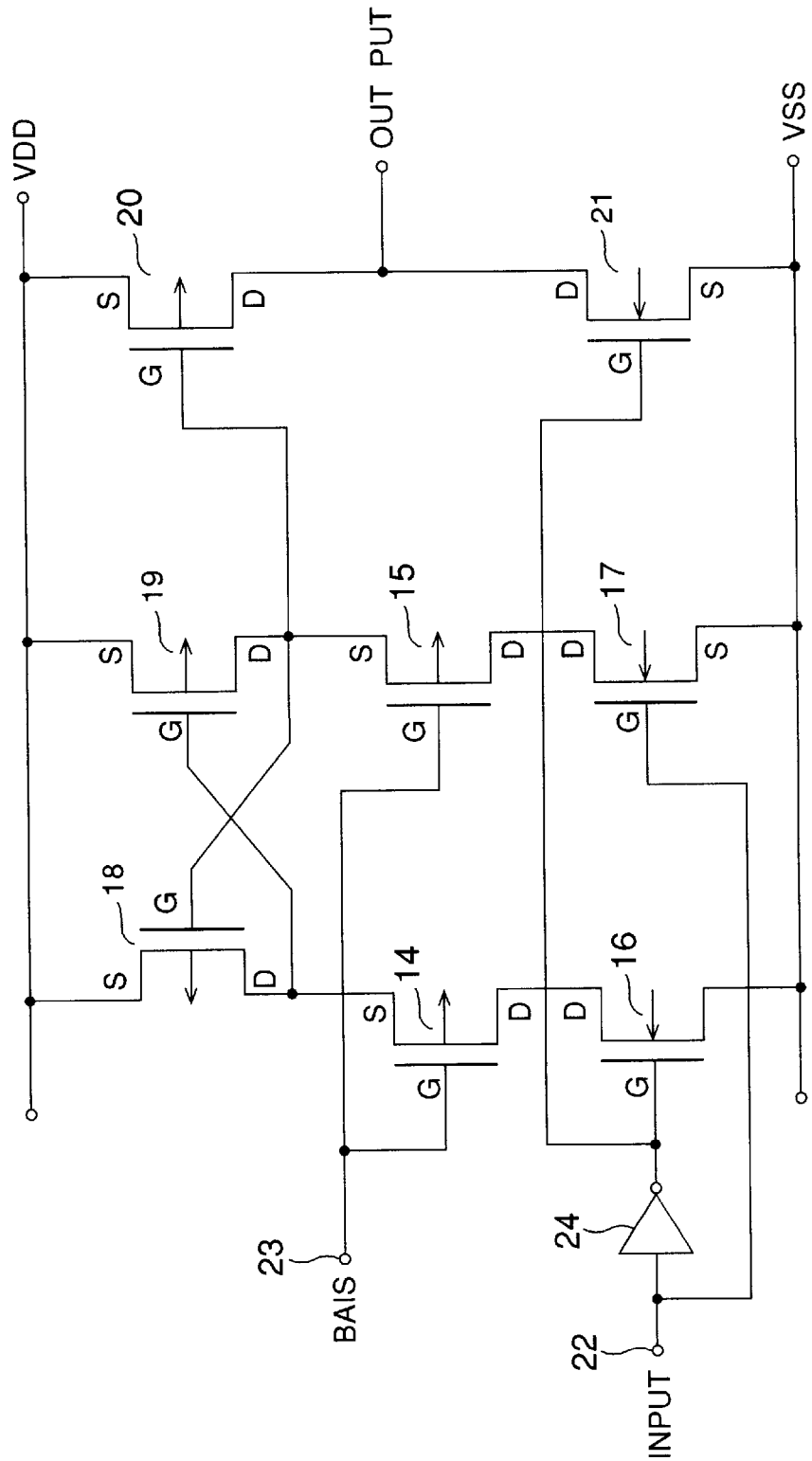
FIG. 7 is a circuit diagram of an example of a conventional level shift circuit.

FIG. 6 illustrates timing charts for explaining the operation of a level shift circuit of FIG. 1. An explanation will be given of the operation of FIG. 1 also in reference to timing charts. During a time period t1 in FIG. 6 where a first and a third input signal ø1 and ø3 are at 5 V (high level) and a second input signal ø2 is at 0 V (low level), the first and the third N-channel MOSFETs N1 and N3 are made ON and the second N-channel MOSFET N2 is made OFF.

Thereby, a drain potential of the first N-channel MOSFET N1 is lowered to a low potential side power source voltage VSS. However, the first P-channel MOSFET P1 is provided with the intermediate tap T1 as a drain and accordingly, the potential V1 of the intermediate tap T1 is not lowered to VSS and a potential slightly lower than VDD is outputted as V1. Further, in this case, to enable the shortening of step, a thickness of the gate oxide film of each of the P-channel MOSFETs P1 and P2 is set to 50 nm and the gate is driven at 20 V which is sufficiently lower than the insulation breakdown voltage (about 50 V) of the gate oxide film such that they can be formed by the gate oxide film forming step the same as that in N-channel MOSFETs N1 and N2. Accordingly, as shown by FIG. 6, the potential V1 of the intermediate tap T1 becomes (VDD–20V) in this case.

The potential V1 of the intermediate tap T1 is applied to the gate of the second P-channel MOSFET P2 and therefore, the second P-channel MOSFET P2 is made ON and the potential V2 of the drain and the intermediate tap T2 thereof becomes the high potential side power source voltage VDD as shown by FIG. 6. The potential V2 (=VDD) of the intermediate tap T2 is applied to the gate of the first P-channel MOSFET P1 whereby the first P-channel MOSFET P1 is made OFF and is applied to the gate of the third P-channel MOSFET P3 whereby the third P-channel MOSFET P3 is made OFF. When the third N-channel MOSFET N3 is made ON and the third P-channel MOSFET P3 is made OFF as described above, the low potential side power source voltage VSS (0 V in FIG. 6) is outputted to the output terminal 4 connected commonly to the drains of the third P-channel MOSFET P3 and the third N-channel MOSFET N3 via the third N-channel MOSFET N3 as shown by FIG. 6.

Next, during a time period T2 shown in FIG. 6 where the first and the third input signals ø1 and ø3 are at 0 V (low level) and the second input signal ø2 is at 5 V (high level), the first and the second N-channel MOSFETs N1 and N3 are made OFF and the second N-channel MOSFET N2 is made ON. Thereby, the drain potential of the second N-channel MOSFET N2 is lowered to the low potential side power source voltage VSS. However, the second P-channel MOSFET P2 is provided with the intermediate tap T2 at its drain and accordingly, the potential V2 of the intermediate tap T2 is not lowered to VSS but a potential (for example, VDD–20V) slightly lower than VDD is outputted as N2 as shown by FIG. 6.

The potential V2 of the intermediate tap T2 is applied to the gate of the first P-channel MOSFET P1 whereby the first P-channel MOSFET P1 is made ON, and is applied to the gate of the third P-channel MOSFET P3 whereby the third P-channel MOSFET P3 is made ON. When the third N-channel MOSFET N3 is made OFF and the third P-channel MOSFET P3 are made ON as described above, the high potential side power source voltage VDD is outputted to the output terminal 4 connected commonly to the drains of the third P-channel MOSFET P3 and the third N-channel MOSFET N3 via the source/drain of the third P-channel MOSFET P3 as shown by FIG. 6.

In this way, according to the embodiment, 5 V of the levels of the input signals ø1 and ø3 and 0 V of the level of the input signal ø2 are shifted to 0 V (=VSS) and further, 0 V of the levels of the input signals ø1 and ø3 and 5 V of the level of the input signal ø2, are shifted to VDD, respectively and are outputted to the output terminal 4. Here, the voltages applied between the gates and the sources of the first, the second and the third P-channel MOSFETs P1, P2 and P3 become approximately VDD through (VDD–2Vth). Accordingly, in respect of the drain/source withstanding voltage of the P-channel MOSFETs P1, P2 and P3, the gate/source voltages may be lowered although high withstanding voltages are necessary for the drain/source withstanding voltages and therefore, the P-channel MOSFETs may be formed with thin gate oxide films similar to those in the N-channel MOSFETs N1, N2 and N3.

As described above, according to the present invention, the fourth and the fifth transistors are provided with the intermediate taps, the intermediate taps are connected mutually to the gates of the fourth and the fifth transistors whereby the transistors are mutually driven, when one of the first and the second transistors is made ON and the other is made OFF, the potential of the intermediate tap of the fourth or the fifth transistor connected to the drain of the first or the second transistor in ON state, is not lowered to the low potential side power source voltage but to a potential slightly lower than the high potential side power source voltage whereby the fifth or the fourth transistor is made OFF. Therefore, the voltages applied between the gates and the sources of the fourth through the sixth transistors may be set in a range of the high potential side power source voltage and a voltage higher than the low potential side power source voltage, the gate/source voltages of the fourth through the sixth transistors may be lowered and accordingly, MOSFETs each having the thin gate oxide film may be used as the fourth through the sixth transistors. Furthermore, the fabrication step can be reduced by making common the first through the third transistors.

Also, the circuit is easier to use than the conventional circuit since the bias voltage is dispensed with. Additionally, the first through the third transistors are respectively the N-channel field effect transistors and the fourth through the sixth transistors are respectively the P-channel field effect transistors and accordingly, compared with the conventional circuit, the number of the P-channel field effect transistors each having an area larger than those of the N-channel field effect transistors in the case where the same current driving capacities are given, can be reduced by the number of the P-channel field effect transistors for voltage conversion which are dispensed with and an area of a total of the circuit can be reduced by a ratio of 3/4 compared with the conventional circuit.

What is claimed is:

1. A level shift circuit comprising:

a first transistor of a first conductive type a gate of which is connected to a first input terminal and a source of which is connected to a power source terminal on a side of a low potential;

a second transistor of the first conductive type a gate of which is connected to a second input terminal and a source of which is connected to the power source terminal on the side of the low potential;

a third transistor of the first conductive type a gate of which is connected to a third input terminal and a source of which is connected to the power source terminal on the side of the low potential;

a fourth transistor of a second conductive type having a drain intermediate tap a drain of which is connected to a drain of the first transistor and a source of which is connected to a power source terminal on a side of a high potential;

a fifth transistor of the second conductive type a gate of which is connected to the drain intermediate tap of the fourth transistor, a drain of which is connected to a drain of the second transistor, a source of which is connected to the power source terminal on the side of the high potential and a drain intermediate tap of which is connected to a gate of the fourth transistor; and a sixth transistor of the second conductive type a gate of which is connected to the drain intermediate tap of the fifth transistor, a drain of which is connected to a drain of the third transistor and an output terminal and a source of which is connected to the power source terminal on the side of the high potential.

2. The level shift circuit according to claim 1, wherein the drain intermediate taps of the fourth and the fifth transistor are provided with a structure where a portion of a drain electric field alleviating layer is drawn out and an intermediate potential between the source and the drain is taken out.

3. The level shift circuit according to claim 1, wherein the first through the third transistors each is an N-channel field effect transistor and the fourth through the sixth transistors each is a P-channel field effect transistor.

4. A circuit comprising:

a first transistor of first conductivity type connected between a first voltage supply line and a first node and having a gate connected to a second node and an intermediate tap connected to a third node;

a second transistor of said first conductivity type connected between said first voltage supply line and a fourth node and having a gate connected to said third node and an intermediate tap connected to said second node;

a third transistor of a second conductivity type connected between said first node and a second voltage supply line and having a gate connected to a first input terminal;

a fourth transistor of said second conductivity type connected between said fourth node and a second voltage supply line and having a gate connected to a second input terminal;

a fifth transistor of said first conductivity type connected between said first voltage supply line and an output node and having a gate connected to said second node; and a sixth transistor of said second conductivity type connected between said output node and said second voltage supply line and having a gate connected to a third input terminal.

5. The circuit as claimed in claim 4, wherein a voltage of intermediate tap of said first transistor is different from a voltage of said second node.

6. The circuit as claimed in claim 5, wherein a voltage of intermediate tap of said second transistor is different from a voltage of said fourth node.

7. The circuit as claime in claim 4, wherein said first and third input terminal receive same phase input signal and said second input terminal receive a signal inverting said input signal.

* * * * *